(12) United States Patent
Kimata et al.

(10) Patent No.: US 7,295,083 B2
(45) Date of Patent: Nov. 13, 2007

(54) STRUCTURE FOR ELECTROMAGNETICALLY SHIELDING A SUBSTRATE

(75) Inventors: Hiroyuki Kimata, Tokyo (JP); Yasuhiro Yamanaka, Tokyo (JP)

(73) Assignee: Mitsubishi Denki Kabushiki Kaisha, Chiyoda-Ku, Tokyo (JP)

( * ) Notice: Subject to any disclaimer, the term of this patent is extended or adjusted under 35 U.S.C. 154(b) by 0 days.

(21) Appl. No.: 10/894,120

(22) Filed: Jul. 20, 2004

(65) Prior Publication Data

US 2005/0206468 A1    Sep. 22, 2005

(30) Foreign Application Priority Data

Mar. 17, 2004    (JP)    ............................. 2004-076659

(51) Int. Cl.
*H05K 9/00*    (2006.01)
*H05K 3/46*    (2006.01)

(52) U.S. Cl. ........................................ 333/12; 361/818

(58) Field of Classification Search .................. 333/12, 333/181, 246, 247; 361/816, 818, 800; 174/51, 174/350; 257/659, 660
See application file for complete search history.

(56) References Cited

U.S. PATENT DOCUMENTS

| | | | |
|---|---|---|---|
| 6,057,600 A * | 5/2000 | Kitazawa et al. ............ | 257/728 |
| 6,118,347 A * | 9/2000 | Ohira .......................... | 331/68 |
| 6,218,610 B1 * | 4/2001 | Suzuki ........................ | 174/35 R |
| 6,243,274 B1 * | 6/2001 | Willis .......................... | 361/816 |
| 6,344,609 B1 * | 2/2002 | Nakano ..................... | 174/35 GC |
| 6,356,173 B1 * | 3/2002 | Nagata et al. .............. | 333/247 |
| 6,377,464 B1 * | 4/2002 | Hashemi et al. ............ | 361/760 |
| 6,775,154 B1 * | 8/2004 | Seely et al. ................. | 361/818 |
| 7,045,881 B2 * | 5/2006 | Hagen et al. ............... | 257/659 |

FOREIGN PATENT DOCUMENTS

| | | |
|---|---|---|
| JP | 5-23566 | 3/1993 |
| JP | 05-198958 | 8/1993 |
| JP | 09-162594 | 6/1997 |
| JP | 09-199818 | 7/1997 |
| JP | 10-270862 | 10/1998 |
| JP | 11-312890 | 11/1999 |
| JP | 11352509 A | * 12/1999 |
| JP | 2000-124482 | 4/2000 |
| JP | 2001-345591 | 12/2001 |
| JP | 2002-134988 | 5/2002 |

OTHER PUBLICATIONS

Japanese Office Action, with English Translation, Issuing Date: Sep. 21, 2006.

* cited by examiner

*Primary Examiner*—Seungsook Ham
(74) *Attorney, Agent, or Firm*—Buchanan Ingersoll & Rooney PC

(57) ABSTRACT

A circuit board that requires electromagnetic shielding is enclosed in a cavity formed between a metal case and a base substrate. A ground plane, which is electrically conductive, is embedded in each of the base substrate and the circuit board. The metal case is electrically connected to the ground planes in both the base substrate and the circuit board.

5 Claims, 5 Drawing Sheets

STRUCTURE FOR ELECTROMAGNETICALLY SHIELDING A SUBSTRATE

BACKGROUND OF THE INVENTION

1) Field of the Invention

The present invention relates to an electromagnetic shield structure for electromagnetically shielding a circuit board substrate. More particularly, the present invention relates to an electromagnetic shield structure that can block electromagnetic noise radiating from a circuit board substrate.

2) Description of the Related Art

Occurrence of electromagnetic noise when circuit elements are powered up is a common phenomenon in a circuit board substrate on which circuit elements such as transistors, IC, LSI, etc. are mounted. If the electromagnetic noise is ignored and no appropriate action is taken to shield it, it may lead to the malfunctioning of the circuit board substrate, the electronic gadget in which the circuit board substrate is used, and/or other electronic gadgets.

There are two approaches to counter this problem. One is to see to it that no major electromagnetic noise occurs in the first place. The other is to suppress the electromagnetic noise, if there is any, so that there is no widespread diffusion outside.

The former approach is a question of selection of the circuit. There are technologies those make it possible to drastically reduce the electromagnetic noise, for instance, see Japanese Patent Laid-Open Publication No. H10-270862. In the technology disclose in this literature, a multi-layer printed circuit board substrate is fabricated by employing the method of assembling on the printed circuit board substrate the circuit elements such as the IC, LSI, etc. and wiring of the power source layer (pattern design).

In the latter approach, a method involving shielding, that is, using an appropriate material to enclose the circuit board substrate so as to block the radiating electromagnetic noise, may be used. Conventional shielding method involves sealing both the surfaces of the circuit board substrate by a metal frame in order to block the electromagnetic noise.

However, the conventional method of sealing both surfaces of the circuit board substrate with a metal frame requires more area because the frame needs to be accommodated. In addition, the cost is higher since the metal frame adds to the product cost.

SUMMARY OF THE INVENTION

It is an object of the present invention to at least solve the problems in the conventional technology.

An electromagnetic shield structure according to an aspect of the present invention is for electromagnetically shielding a target substrate. The target substrate has a first surface, a second surface opposite to the second surface, and a plurality of side surfaces. The electromagnetic shield structure includes a metal case that covers the first surface and the side surfaces of the target substrate; and a base substrate that opposes the second surface. The metal case rests on the base substrate. The base substrate holds a first ground plane that is electrically connected to the metal case.

The other objects, features, and advantages of the present invention are specifically set forth in or will become apparent from the following detailed description of the invention when read in conjunction with the accompanying drawings.

DETAILED DESCRIPTION

Exemplary embodiments of an electromagnetic shield structure according to an embodiment of the present invention are explained next with reference to the accompanying drawings. Although the invention has been described with respect to specific embodiments for a complete and clear disclosure, the appended claims are not to be thus limited but are to be construed as embodying all modifications and alternative constructions that may occur to one skilled in the art which fairly fall within the basic teaching herein set forth.

Figure 1:
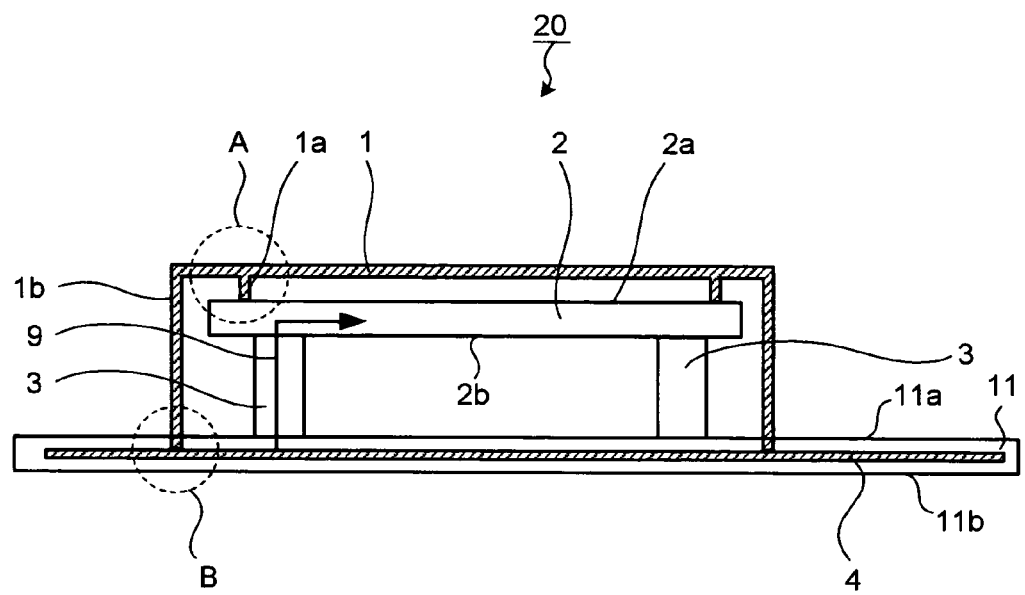
FIG. 1 is a cross-section of an electromagnetic shield structure according to an embodiment of the present invention.
Figure 2:
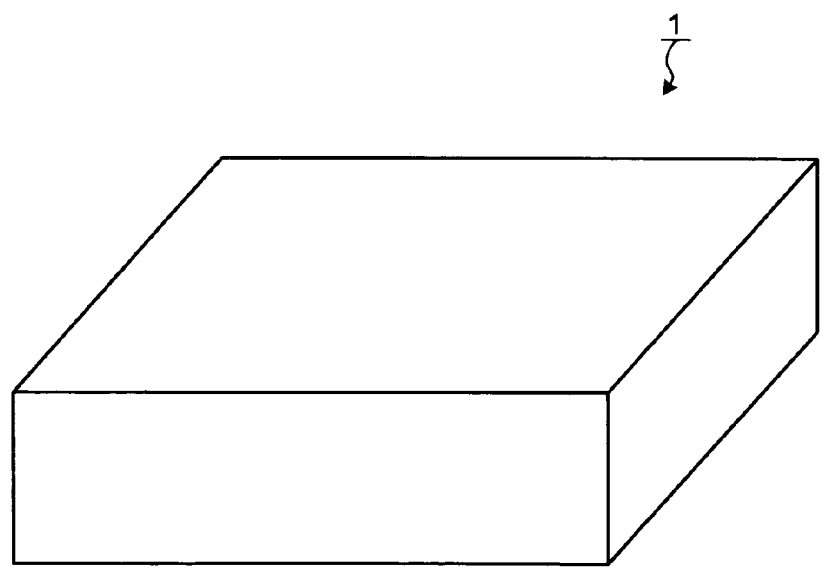
FIG. 2 is a perspective view from above of the metal frame shown in FIG. 1.
Figure 3:
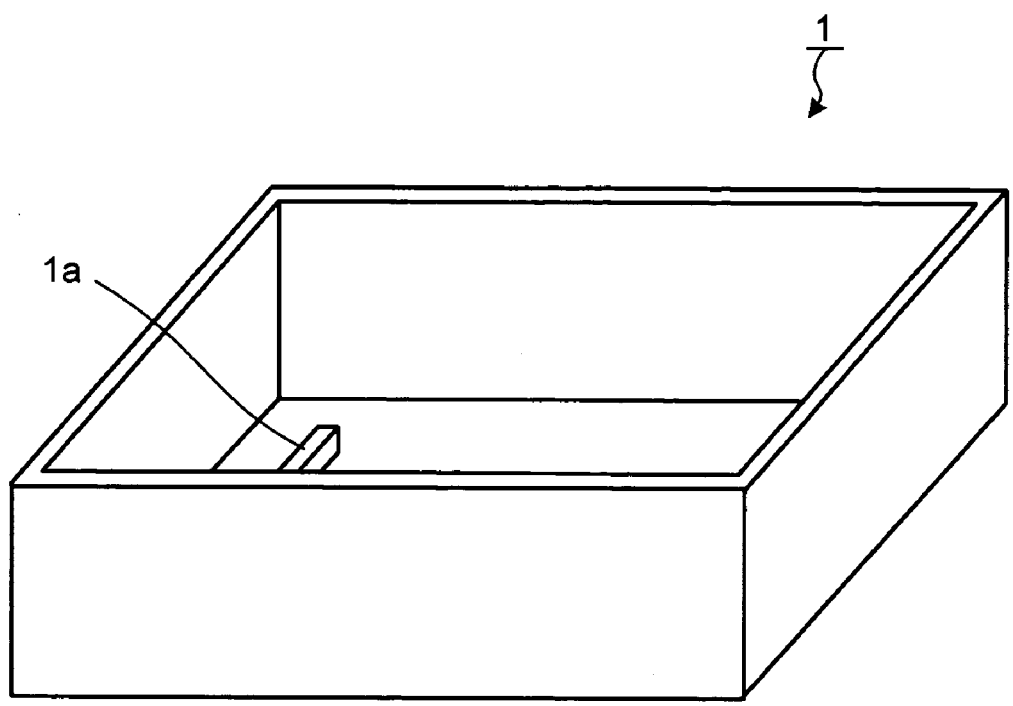
FIG. 3 is a perspective view from below of the metal frame.

FIG. 1 is a cross-section of an electromagnetic shield structure according to an embodiment of the present invention. An electromagnetic shield-requiring substrate 2 in FIG. 1 is the circuit board substrate that is shielded by the electromagnetic shield structure. Various kinds of circuit elements such as transistors, integrated circuits (ICs), large-scale integrations (LSIs), etc. are mounted on the electromagnetic shield-requiring substrate 2. When these circuit elements are powered up, they produce an electromagnetic noise. If the electromagnetic noise is ignored and no appropriate action is taken to check it, it may lead to malfunctioning of the electromagnetic shield-requiring substrate 2 and the electronic gadget of which the electromagnetic shield-requiring substrate 2 is a part, and in addition, may cause other electronic gadgets to malfunction as well. The present embodiment aims to block the electromagnetic noise. A metal frame 1 encloses a top surface 2a and sides of the electromagnetic shield-requiring substrate 2. As shown in FIG. 2 and FIG. 3, the metal frame 1 is a one-side-open, rectangular, metal case. FIG. 2 is a perspective view of the metal frame 1 viewed from above and FIG. 3 is a perspective view of the metal frame 1 viewed from below.

The metal frame 1 may be made of any material as long as it effectively blocks the electromagnetic noise.

Further, although it is mentioned above that the metal frame 1 is one-side-open, rectangular, metal case, it may have any other shapes. For instance, the metal frame 1 may be of a shape that is same as that of the electromagnetic shield-requiring substrate 2, or of a shape that is same as that of the electronic gadget in which the electromagnetic shield-requiring substrate 2 is mounted. The metal frame 1 may be of any shape as long as it effectively encloses the top surface and the sides of the electromagnetic shield-requiring substrate 2.

The metal frame 1 may also be of any size, such as to suit the size of the electromagnetic shield-requiring substrate 2 or the space inside the electronic gadget in which the electromagnetic shield-requiring substrate 2 is mounted, etc. as long as the metal frame 1 effectively encloses the top surface and the sides of the electromagnetic shield-requiring substrate 2.

Figure 4:
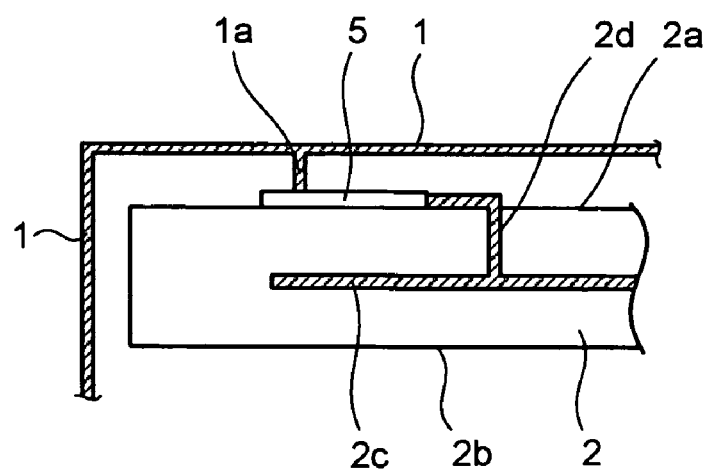
FIG. 4 is a magnified cross-section of a region of connection between the metal frame and an electromagnetic shield-requiring substrate.

The metal frame 1 is electrically connected to the electromagnetic shield-requiring substrate 2 via connecting members 1a provided inside the metal frame 1. To be more specific, the metal frame 1 is connected to a connector pad 5 (see FIG. 4) provided on the surface (the top surface 2a in FIG. 1), in other words, the side that is opposite to a base substrate 11, of the electromagnetic shield-requiring substrate 2 which is facing the metal frame 1. The connector pad 5 is connected to an embedded ground (GND) plane 2c provided within the electromagnetic shield-requiring substrate 2. FIG. 4 is a magnified view of the region A shown in FIG. 1, which is the point of connection between the metal frame 1 and the electromagnetic shield-requiring substrate 2.

The connector pad 5 and the embedded GND plane 2c are electrically connected by a through hole 2d that traverses widthwise from the top surface 2a of the electromagnetic shield-requiring substrate 2 to the embedded GND plane 2c. This connector pad 5 may be etched to match the surface pattern that is pre-etched on the top surface 2a of the electromagnetic shield-requiring substrate 2. If the electromagnetic shield-requiring substrate 2 is a printed circuit board and the like, the connector pad 5 can be etched together with the wiring print, thus making the etching process simple.

The through hole 2d may have any shape or size as long as it enables the embedded GND plane 2c and the top surface 2a of the electromagnetic shield-requiring substrate 2 to be effectively electrically connected. Further, there are no limitations on the number of through holes 2d, and any number of through holes 2d may be provided.

Further, the connector pad 5 used in the electromagnetic shield according to the present invention may be of any material as long as it enables the metal frame 1 and the electromagnetic shield-requiring substrate 2 to be effectively electrically connected.

The connector pad 5 again may be of any shape as long as it enables the metal frame 1 and the electromagnetic shield-requiring substrate 2 to be effectively electrically connected, and may have a shape that matches the shape of the connecting member 1a, and the like.

The connector pad 5 may be of any size as long as it enables the metal frame 1 and the electromagnetic shield-requiring substrate 2 to be effectively electrically connected, and may be of a size that matches the size of the connecting member 1a, and the like.

The other surface (the bottom surface 2b) of the electromagnetic shield-requiring substrate 2 is covered by the base substrate 11 provided on the side of the bottom surface 2b of the electromagnetic shield-requiring substrate 2. The base substrate 11 functions as a foundation for the electromagnetic shield-requiring substrate 2. The base substrate 11 is disposed substantially parallel to and at a predetermined distance from the electromagnetic shield-requiring substrate 2.

An embedded GND plane 4 is disposed in the base substrate 11 running roughly parallel to the main surfaces (a top surface 11a and a bottom surface 1b) of the base substrate 11. The width of the embedded GND plane 4 is broader than the width of the electromagnetic shield-requiring substrate 2 in all directions. Consequently, the bottom surface 2b of the electromagnetic shield-requiring substrate 2 is covered by the embedded GND plane 4 provided within the base substrate 11.

The base substrate 11 having such a structure is connected to the electromagnetic shield-requiring substrate 2 via connectors 3 provided on the top surface 11a of the base substrate 11. An input/output 9 of power and signals from the base substrate 11 to the electromagnetic shield-requiring substrate 2 takes place via the connectors 3. Consequently, no opening is required in the metal frame 1 for connection to the outside.

Figure 5:
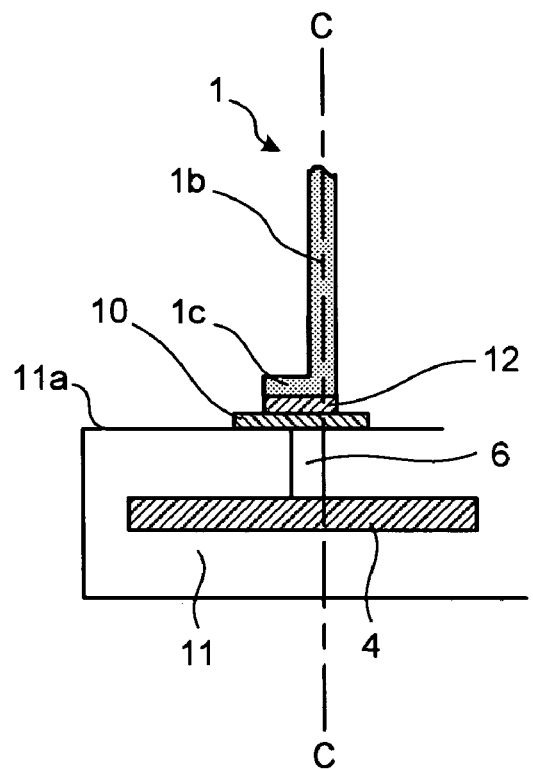
FIG. 5 is a magnified cross-section of a region of connection between the metal frame and a base substrate.
Figure 6:
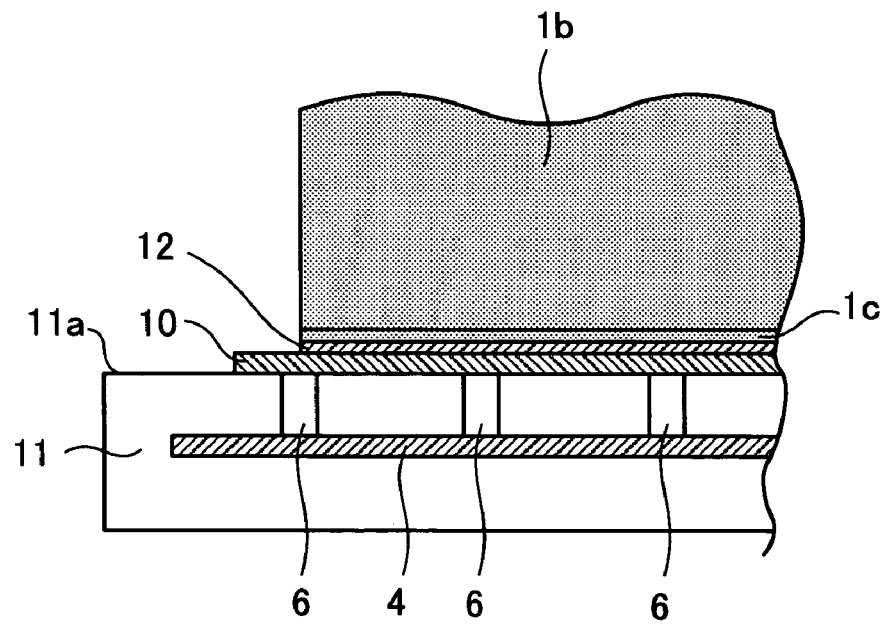
FIG. 6 is a cross-section along the line C-C shown in FIG. 5.

The base substrate 11 is electrically connected to the metal frame 1 via a connector pad 10 provided on the surface (the top surface 11a in FIG. 1, FIG. 5, and FIG. 6) of the base substrate 11 that faces the electromagnetic shield-requiring substrate 2. To be more specific, as shown in FIG. 5, the base substrate 11 is connected via the connector pad 10 to a mounting member 1c provided at an end of a side surface 1b of the metal frame 1. The connector pad 10 and the mounting member 1c may for instance be connected by a solder 12. The connector pad 10 is connected to the embedded GND plane 4 provided within the base substrate 11. FIG. 5 is a magnified view of the region B shown in FIG. 1, which is the point of connection between the metal frame 1 and the base substrate 11. FIG. 6 is a view of the region B shown in FIG. 5 cut along the line C-C.

The connector pad 10 and the embedded GND plane 4 are electrically connected by a through hole 6 that traverses widthwise from the top surface 11a of the base substrate 11 to the embedded GND plane 4.

The through hole 6 may have any shape or size as long as it enables the embedded GND plane 4 and the connector pad 10 to be effectively electrically connected. Further, there are no limitations on the number of through holes 6, and any number of through holes 6 may be provided.

Further, the connector pad 10 used in the electromagnetic shield may be of any material as long as it enables the metal frame 1 and the embedded GND plane 4 to be effectively electrically connected, and effectively blocks the electromagnetic noise issuing from the electromagnetic shield-requiring substrate 2.

The connector pad 10 again may be of any shape as long as it enables the metal frame 1 and the embedded GND plane 4 to be effectively electrically connected, and effectively blocks the electromagnetic noise issuing from the electromagnetic shield-requiring substrate 2. The connector pad 10 may have a shape that matches the shape of the through hole 6 and that of the mounting member 1c.

The connector pad 10 may be of any size as long as it enables the metal frame 1 and the electromagnetic shield-requiring substrate 2 to be effectively electrically connected, and effectively blocks the electromagnetic noise issuing from the electromagnetic shield-requiring substrate 2. The connector pad 10 may be of a size that matches the size of the through hole 6 or that of the mounting member 1c.

In this manner, according to the present invention, the electromagnetic shield-requiring substrate 2 is covered by a metal frame 1 and the embedded GND plane 4 of the base substrate 11. In other words, in this structure, the electromagnetic shield-requiring substrate 2 is electromagnetically sealed by the metal frame 1 and the embedded GND plane 4 of the base substrate 11. This structure effectively blocks the electromagnetic noise that is issued when the circuit elements such as the transistor, IC, LSI, etc. mounted on the electromagnetic shield-requiring substrate 2 are powered up. Thus, the electromagnetic shield-requiring substrate is effectively shielded by the metal frame 1 and the embedded GND plane 4 of the base substrate 11. As a result, malfunctioning of the electromagnetic shield-requiring substrate 2 or the electronic gadget in which the electromagnetic shield-requiring substrate 2 is mounted, and other electronic gadgets caused by the electromagnetic noise issuing from the electromagnetic shield-requiring substrate 2 can be prevented.

In this electromagnetic shield structure, the top surface 2a and the sides of the electromagnetic shield-requiring substrate 2 are covered by the metal frame 1, and the bottom surface 2a of the electromagnetic shield-requiring substrate 2 is covered by the embedded GND plane 4 of the base substrate 11 disposed facing the bottom surface 2b of the electromagnetic shield-requiring substrate 2.

Figure 7:
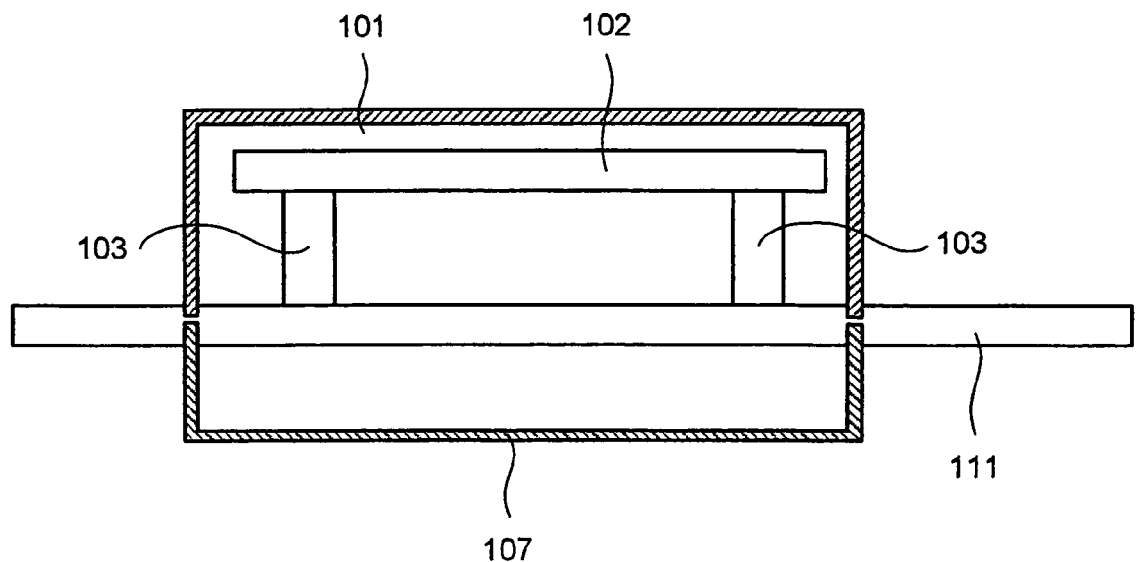
FIG. 7 is a cross-section of a conventional electromagnetic shield structure.

In a conventional electromagnetic shield structure, as shown in FIG. 7, an electromagnetic shield-requiring substrate 102 is fixed to a base substrate 111 by connectors 103. The base substrate 111 functions as a foundation for the electromagnetic shield-requiring substrate 102. Both surfaces (a top surface 102a and a bottom surface 102b) of the electromagnetic shield-requiring substrate 102 are sealed by covering them with metal frames 101 and 107. Thus, this structure enables blockade of the electromagnetic noise. However, in this structure, more area is required for accommodating the two metal frames 101 and 107. Besides, this structure leads to higher components cost since two metal frames 101 and 107 are required.

However, in the electromagnetic shield structure according to the present invention, the need to enclose all the surfaces of the electromagnetic shield-requiring substrate 2 with a metal frame is obviated. In other words, as against two metal frames 101 and 107 required in the conventional electromagnetic shield structure, only one metal frame 1 is required in the present invention. Consequently, the area required for accommodating the metal frame can be drastically reduced. Thus, the electromagnetic shield structure 20 of the electromagnetic shield-requiring substrate 2 is space-efficient. As a result, the electronic gadget using this space-efficient electromagnetic shield-requiring substrate 2 can be made really compact.

In the electromagnetic shield structure of the present invention, the need to enclose all the surfaces of the electromagnetic shield-requiring substrate 2 with a metal frame is obviated. In other words, as against two metal frames 101 and 107 required in the conventional electromagnetic shield structure, only one metal frame 1 is required in the present invention. Consequently, the weight of the metal frame can be drastically reduced. Thus, a light electromagnetic shield structure 20 is realized. As a result, the electronic gadget using this light electromagnetic shield-requiring substrate 2 can be made lightweight.

In the electromagnetic shield structure of the present invention, the need to enclose all the surfaces of the electromagnetic shield-requiring substrate 2 with a metal frame is obviated. In other words, as against two metal frames 101 and 107 required in the conventional electromagnetic shield structure, only one metal frame 1 is required in the present invention. Consequently, the cost of the metal frame can be drastically reduced. Thus, a cost-effective electromagnetic shield structure 20 is realized. As a result, the cost of the electronic gadget using this cost-effective electromagnetic shield-requiring substrate 2 can be effectively reduced.

Thus, according to the present invention, a space-efficient and cost-effective electromagnetic shield structure is realized that enables electromagnetic shielding of the electromagnetic shield-requiring substrate 2.

Figure 8:
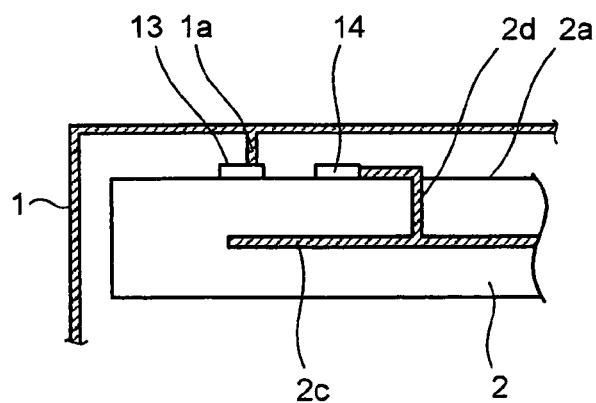
FIG. 8 is a magnified cross-section of an electromagnetic shield structure according to another embodiment of the present invention.
Figure 9:
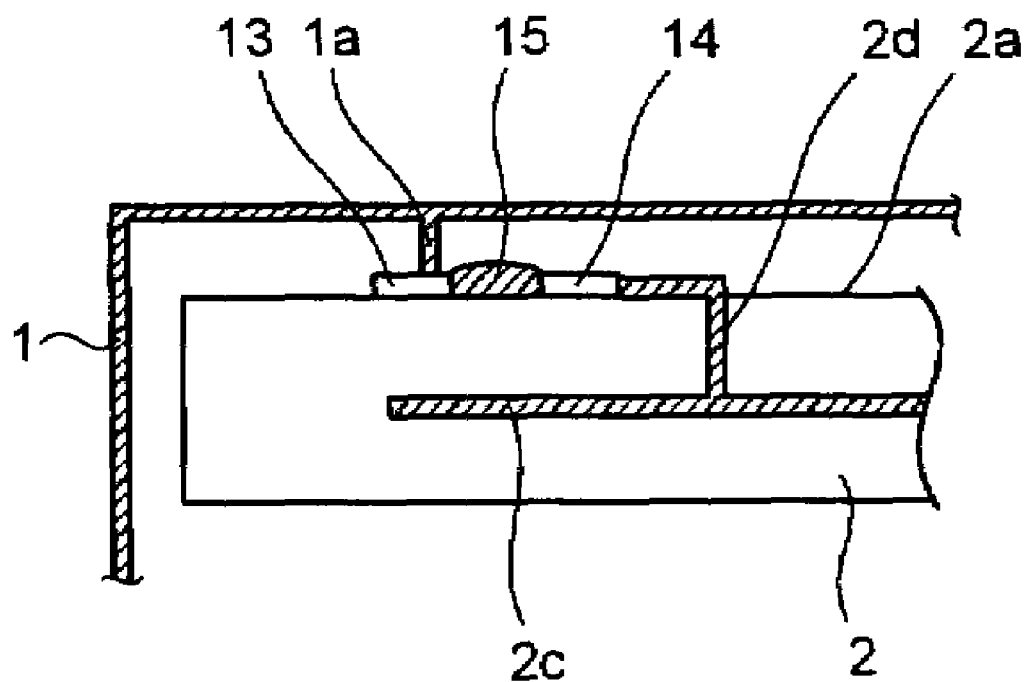
FIG. 9 is a magnified cross-section of an electromagnetic shield structure according to still another embodiment of the present invention.

In the above description, a structure is explained in which the metal frame 1 and the electromagnetic shield-requiring substrate 2 are uniquely connected through the connection between the connecting members 1a of the metal frame 1 and the connector pads 5 of the electromagnetic shield-requiring substrate 2. However, in the present invention, a structure can be obtained in which the connection can be selected. In other words, as shown in FIG. 8, a connector pad 13 is provided on the top surface 2a of the electromagnetic shield-requiring substrate 2 corresponding to the connecting member 1a of the metal frame 1. A chip part 14 that connects with the embedded GND plane 2c of the electromagnetic shield-requiring substrate 2 is provided on the top surface 2a of the electromagnetic shield-requiring substrate 2. Thus a structure is obtained in which the metal frame 1 and the electromagnetic shield-requiring substrate 2 can be electrically connected by connecting the connector pad 13 and the chip part 14 by a solder 15, as shown in FIG. 9. This structure enables the selection of whether or not the metal frame 1 and the embedded GND plane 2 of the electromagnetic shield-requiring substrate 2 are to be connected, at the step in which electromagnetic noise radiation is evaluated.

The chip part may be a condenser, resistor, inductor, ferrite beats, and the like. The electromagnetic shielding effect of the electromagnetic shield structure according to the present invention can be controlled in according to the selection of the chip part.

It is preferable to mount faster circuits on the electromagnetic shield-requiring substrate 2 and slower circuits on the base substrate 11. In this way, more circuits can be mounted, and in spite of more circuits, the electromagnetic waves issuing from the electromagnetic shield-requiring substrate 2 and the base substrate 11 can be effectively blocked.

The electromagnetic shield structure according the present invention can be adapted as an electromagnetic shield of any circuit board substrate that issues electromagnetic noise, though it is most suitable for electronic gadgets in which very low electromagnetic radiation, if at all, from the circuit board substrate is desirable. The electromagnetic shield structure according to the present invention may be used in electronic gadgets in which space-efficiency is desirable. The usefulness of the electromagnetic shield structure can be more effectively demonstrated by using it in electronic gadgets in which very low electromagnetic radiation from the circuit board substrate as well as space efficiency is desirable.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. An electromagnetic shield structure for electromagnetically shielding a target substrate mounted with at least one electromagnetic noise generating circuit element, the target substrate having a first surface, a second surface opposite to the first surface, and a plurality of side surfaces, comprising:
    a metal case that covers the first surface and the side surfaces of the target substrate;
    a base substrate that opposes the second surface, wherein the metal case rests on the base substrate, a first ground plane, that is electrically connected to the metal case, is embedded in the base substrate and is parallel to main surfaces of the base substrate;

connectors provided on a top surface of the base substrate, the connectors mount the target substrate above the top surface of the base substrate, wherein the connectors are a means for input/output of power and signals from the base substrate to the target substrate; and a second ground plane embedded in the target substrate.

2. The electromagnetic shield structure according to claim 1, wherein at least a part of the metal case and the first ground plane are electrically connected via a through hole through the base substrate.

3. The electromagnetic shield structure according to claim 1, wherein the metal case is electrically connected to the second ground plane provided within the target substrate.

4. The electromagnetic shield structure according to claim 1, further comprising a selecting unit for selectively electrically connecting the second ground plane and the metal case.

5. The electromagnetic shield structure according to claim 4, wherein the selecting unit includes a first member that is electrically connected to the second ground plane; and a second member that is electrically connected to the metal case; and a selecting member that electrically connects or disconnects the first member and the second member.

* * * * *